(12) United States Patent
Huang

(10) Patent No.: US 9,000,855 B2
(45) Date of Patent: Apr. 7, 2015

(54) CIRCUIT AND METHOD FOR DETECTING OSCILLATING FREQUENCY DRIFT

(75) Inventor: Ming-Chung Huang, Taichung (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 445 days.

(21) Appl. No.: 13/473,608

(22) Filed: May 17, 2012

(65) Prior Publication Data

US 2012/0303307 A1 Nov. 29, 2012

(30) Foreign Application Priority Data

May 25, 2011 (TW) .............................. 100118323 A

(51) Int. Cl.
*H03L 1/00* (2006.01)
*H03L 1/02* (2006.01)

(52) U.S. Cl.
CPC ...................................... *H03L 1/027* (2013.01)

(58) Field of Classification Search
USPC .................................................. 331/176, 158
See application file for complete search history.

(56) References Cited

U.S. PATENT DOCUMENTS

| 5,654,718 | A | 8/1997 | Beason |
| 5,854,605 | A | 12/1998 | Gildea |
| 6,509,870 | B1 | 1/2003 | Matsushita |
| 6,661,302 | B1 * | 12/2003 | Rathore et al. ................ 331/158 |
| 7,015,767 | B2 * | 3/2006 | Shingu et al. ................. 331/176 |
| 7,098,749 | B2 * | 8/2006 | Forrester ....................... 331/176 |
| 7,148,761 | B1 | 12/2006 | Shieh |
| 7,375,681 | B1 | 5/2008 | Woo |
| 7,586,382 | B2 | 9/2009 | Wang |
| 8,031,024 | B1 * | 10/2011 | Zaslavsky ..................... 331/176 |
| 8,736,389 | B2 * | 5/2014 | Wang et al. ................... 331/158 |
| 2004/0120418 | A1 | 6/2004 | Pasternak |
| 2006/0267703 | A1 | 11/2006 | Wang |
| 2009/0323864 | A1 | 12/2009 | Tired |

FOREIGN PATENT DOCUMENTS

TW 200943859 10/2009

* cited by examiner

*Primary Examiner* — Joseph Chang
(74) *Attorney, Agent, or Firm* — Winston Hsu; Scott Margo

(57) ABSTRACT

An oscillating frequency drift detecting method, which comprises: receiving an oscillating signal with an oscillating frequency, wherein the oscillating signal is generated by a crystal oscillator; generating a self-mixing signal according to the oscillating signal; obtaining a self-mixing frequency of a maximum power of the self-mixing signal in a specific frequency range; and computing a frequency drift of the oscillating frequency, according to the self-mixing frequency of the maximum power, and the oscillating frequency.

15 Claims, 7 Drawing Sheets

CIRCUIT AND METHOD FOR DETECTING OSCILLATING FREQUENCY DRIFT

BACKGROUND OF THE INVENTION

1. Field of the Invention

The present invention relates to an oscillating circuit, and particularly relates to an oscillating frequency drift detecting method and circuit.

2. Description of the Prior Art

FIG. 1 is a schematic diagram illustrating the relation between temperature and an output oscillating frequency of the crystal oscillator. The oscillating frequency output by the crystal oscillator may drift under different temperatures. The drift will cause a curve in an S shape, thereby the curve is called a S curve. Such oscillating frequency drift will cause obvious effect to an electronic apparatus. One of the compensating methods is utilizing a temperature compensated crystal oscillator to solve this issue. The temperature compensated crystal oscillator costs a much higher price than a normal one, however. Another method is acquiring the S curve in advance (ex. provided by the manufacturer), and utilizing another crystal oscillator to compensate it. However, such compensation operation needs complicated control, even the S curve is acquired.

SUMMARY OF THE INVENTION

One objective of the present application is to provide an oscillating frequency drift detecting method and circuit, to solve above-mentioned issues.

Another objective is to provide an oscillating frequency drift detecting method and circuit, to compensate oscillating frequency drift without complicated control mechanism.

One embodiment of the present invention discloses an oscillating frequency drift detecting method, which comprises: receiving an oscillating signal with an oscillating frequency, wherein the oscillating signal is generated by a crystal oscillator; generating a self-mixing signal according to the oscillating signal; obtaining a self-mixing frequency of a maximum power of the self-mixing signal in a specific frequency range; and computing a frequency drift of the oscillating frequency, according to the self-mixing frequency of the maximum power, and the oscillating frequency.

Another embodiment of the present invention discloses an oscillating frequency drift detecting circuit, which comprises: a self-mixer, for generating a self-mixing signal according to an oscillating signal, wherein the oscillating signal includes an oscillating frequency; and a control circuit, for computing a self-mixing frequency of the self-mixing signal of a maximum power between a specific frequency range; and computing a frequency drift of the oscillating frequency, according to the self-mixing frequency and the oscillating frequency.

Via above-mentioned embodiments, a simple circuit can be utilized to detect oscillating frequency drift, and then the oscillating frequency drift can be compensated.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
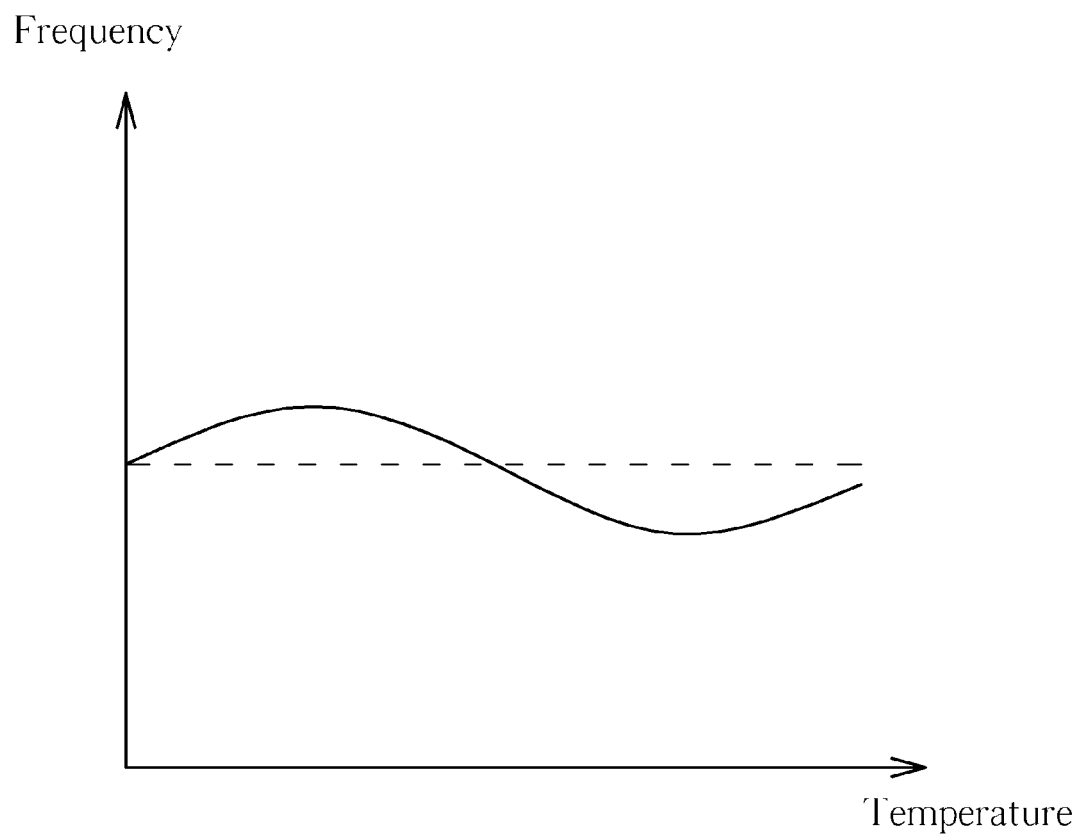
FIG. 1 is a schematic diagram illustrating the relation between temperature and an output oscillating frequency of the crystal oscillator.
Figure 2:
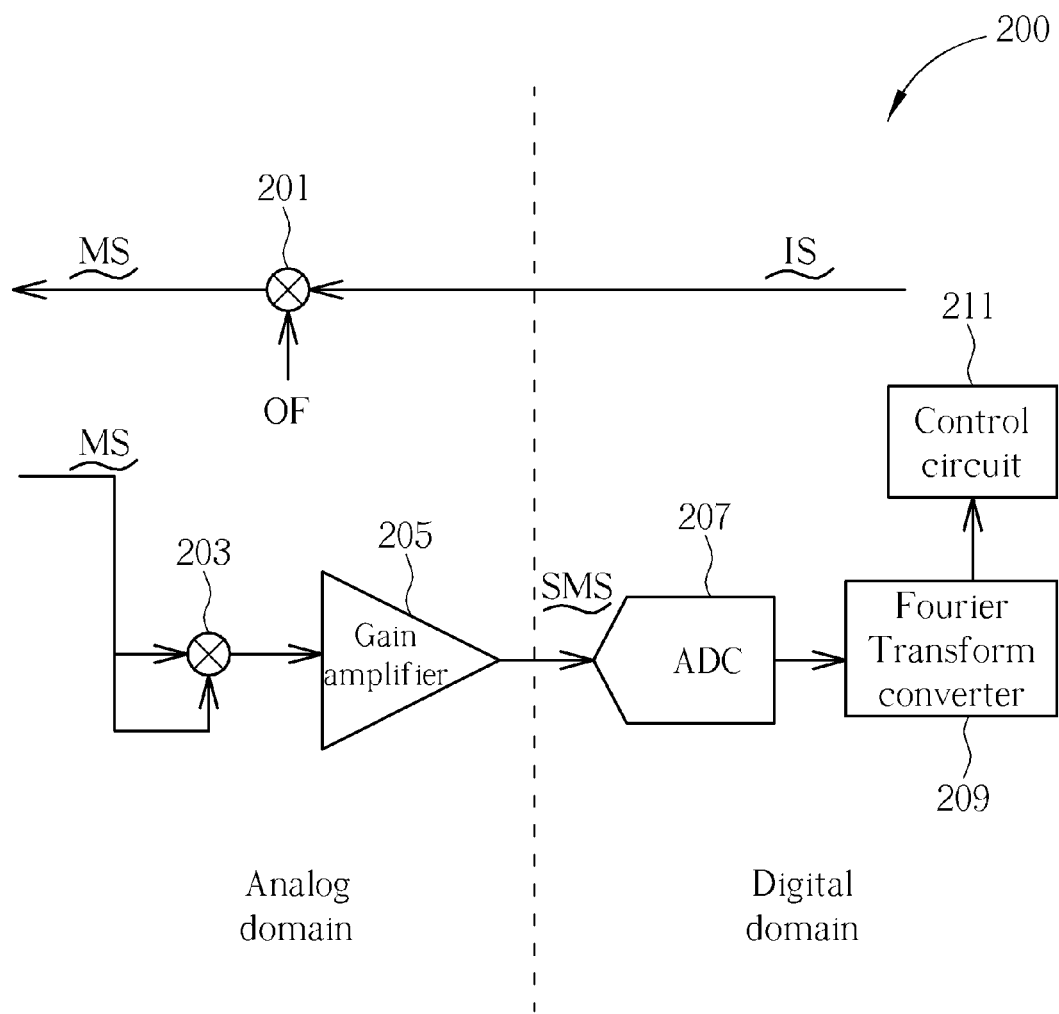
FIG. 2 is a circuit diagram illustrating an oscillating frequency drift detecting circuit according to one embodiment of the present application.

FIG. 2 is a circuit diagram illustrating an oscillating frequency drift detecting circuit 200 according to one embodiment of the present application. As shown in FIG. 2, the detection circuit 200 includes a frequency mixer 201, a self mixer 203, a gain amplifier 205, an ADC 207, a Fourier transform converter 209, and a control circuit 211. The frequency mixer 201 mixes an oscillating frequency OF, which is generated by a target to be detected, to an input signal IS with an input frequency f, to generate a mixing signal MS. After the mixing signal MS is transmitted to the self-mixer 203, the self-mixer 203 is utilized for self-mixing to generate a self-mixing signal SMS. After that, the self-mixing signal SMS is transformed from an analog domain to a digital domain (ex. utilize the ADC 207 to transform), and the Fourier transform converter 209 perform Fourier Transform to the self-mixing signal SMS. Next, the control circuit 211 acquires a self-mixing frequency $f_{power\_max}$ of a max amplitude (i.e. power) in a specific (fixed) range for a twice oscillating frequency of the self-mixing signal SMS after Fourier transform converter. Then, the control circuit 211 divides the self-mixing frequency $f_{power\_max}$ with 2, and comparing the divided self-mixing frequency $f_{power\_max}$ with the oscillating frequency OF and the input frequency f, to acquire a frequency drift of frequency OF from a predetermined frequency. The predetermined frequency is the oscillating frequency that is supposed to be generated by the crystal oscillator.

The detail operations of the detection circuit 200 will be described as below:

The signal IS is supposed to be cos(2*pi*f*t), wherein f is an input frequency.

The mixing-signal MS can be shown as Equation (1):

$$MS=IS*OF=\cos(2*pi*f*t)*\cos(2*pi*fOF*t)=\frac{1}{2}*[\cos(2*pi*(f-fOF)*t)+\cos(2*pi*(f+fOF)*t)] \quad \text{Equation (1)}$$

$f_{OF}$ is the oscillating frequency output by the crystal oscillator to be tested (i.e. frequency of the signal OF). Thereby the self-mixing signal generates five frequency portions which will be described later f is the above-mentioned IS input frequency which can be a frequency of an output signal from an ADC.

the OF signal shown in FIG. 2.

If the signal OF includes a frequency drift $f_s$, then the actual OF frequency equals to the predetermined OF frequency plus $f_s$.

Accordingly, after mixing IS to OF, the mixing-signal MS shown in FIG. 2 will be acquired:

$$B = \cos(2\pi f t) \cdot \cos[2\pi(f_{OF} + f_s)t] =$$
$$\frac{1}{2}\{\cos[2\pi(f - f_{OF} - f_s)t] + \cos[2\pi(f + f_{OF} + f_s)t]\}$$

The detail computation of the self-mixing operation can be shown as follows:

Suppose $a=c=\cos[2\pi(f-f_{OF}-f_s)t]$

And $b=d=\cos[2\pi(f+f_{OF}+f_s)t]$

It can be obtained after the self-mixing of B:

$$B \cdot B = \frac{1}{2}(a+b) \cdot \frac{1}{2}(c+d)$$
$$= \frac{1}{4}(ac + ad + bc + bd)$$

$$ac = \frac{1}{2}\{1 + \cos[2\pi \cdot 2(f - f_{OF} - f_s)t]\}$$

$$ad = \frac{1}{2}\{\cos[2\pi \cdot 2(-2f_{OF} - 2f_s)t] + \cos(2\pi \cdot 2ft)\}$$

$$bc = \frac{1}{2}\{\cos[2\pi \cdot 2(2f_{OF} + 2f_s)t] + \cos(2\pi \cdot 2ft)\}$$

$$bd = \frac{1}{2}\{1 + \cos[2\pi \cdot 2(f + f_{OF} + f_s)t]\}$$

$$ac + bd = 1 + \frac{1}{2}\{\cos[2\pi \cdot 2(f - f_{OF} - f_s)t] +$$
$$\cos[2\pi \cdot 2(f + f_{OF} + f_s)t]\}$$
$$= 1 + \frac{1}{2}\{\cos[2\pi(2f_{OF} + 2f_s + 2f)t] +$$
$$\cos[2\pi(2f_{OF} + 2f_s + 2f)t]\}$$

$$ad + bc = \cos[2\pi \cdot 2(2f_{OF} + 2f_s)t] + \cos(2\pi \cdot 2ft)\}$$

In view of above-mentioned equations, the self-mixing signal SMS may includes 5 frequency portions:

| | |
|---|---|
| Frequency 1 → DC portion | frequency portion (1) |
| Frequency 2 → 2f | frequency portion (2) |
| Frequency 3 → $2f_{OF} + 2f_s - 2f$ | frequency portion (3) |
| Frequency 4 → $2f_{OF} + 2f_s$ | frequency portion (4) |
| Frequency 5 → $2f_{OF} + 2f_s + 2f$ | frequency portion (5) |

According to the frequency portions (3), (4) and (5), the frequency portion (4) equals to twice of the oscillating frequency $f_{OF}$, if the oscillating frequency $f_{OF}$ has no drift. Also, the frequency portions (3) and (5) equals to twice the oscillating frequency $f_{OF}$ plus or minus twice the input frequency f.

However, if the oscillating frequency $f_{OF}$ generates frequency drift $f_s$, the frequency portions (3), (4) and (5) of the self-mixing signal SMS have twice the frequency drift $f_s$ besides the original portions. Accordingly, the frequency drift can be acquired from the frequency portions (3), (4) and (5) (All of the three frequency portions include frequency drift information. But any one frequency can be utilized to compute the frequency drift, it is not necessary that all portions are utilized to compute frequency drift. That is why a specific range is selected). Please note that if only frequency portion (4) is utilized for detection, and portions (3) and (5) are not utilized, the input frequency has no influence. In this case, the embodiment shown in FIG. 2 can receive no input signal IS, and only utilizes the signal with oscillating frequency OF for self-mixing, thereby the frequency drift can also be acquired. The frequency mixer 201 can be omitted by this way.

According to the frequency portions (3), (4) and (5), the oscillating frequency drift $f_s$ can be acquired via: computing the a frequency of the max power in a specific range of twice the oscillating frequency $f_{OF}$ of the digitalized self-mixing signal SMS (one method is performing Fourier Transform to the digitalized self-mixing signal SMS, as shown in FIG. 2); and then dividing the self-mixing frequency with 2, and comparing the divided self-mixing frequency $f_{OF}$ with the input frequency f to acquire the frequency drift $f_s$. The frequency drift can be computed by this way since the relations of different frequency portions are already known. However, different comparing methods can be performed. For example, multiplying the oscillating frequency $f_{OF}$ and the input frequency f for 2 and then comparing, twice the oscillating drift 2 fs can be acquired. Such kind of simple variation should be included in the scope of the present application.

Figure 3:
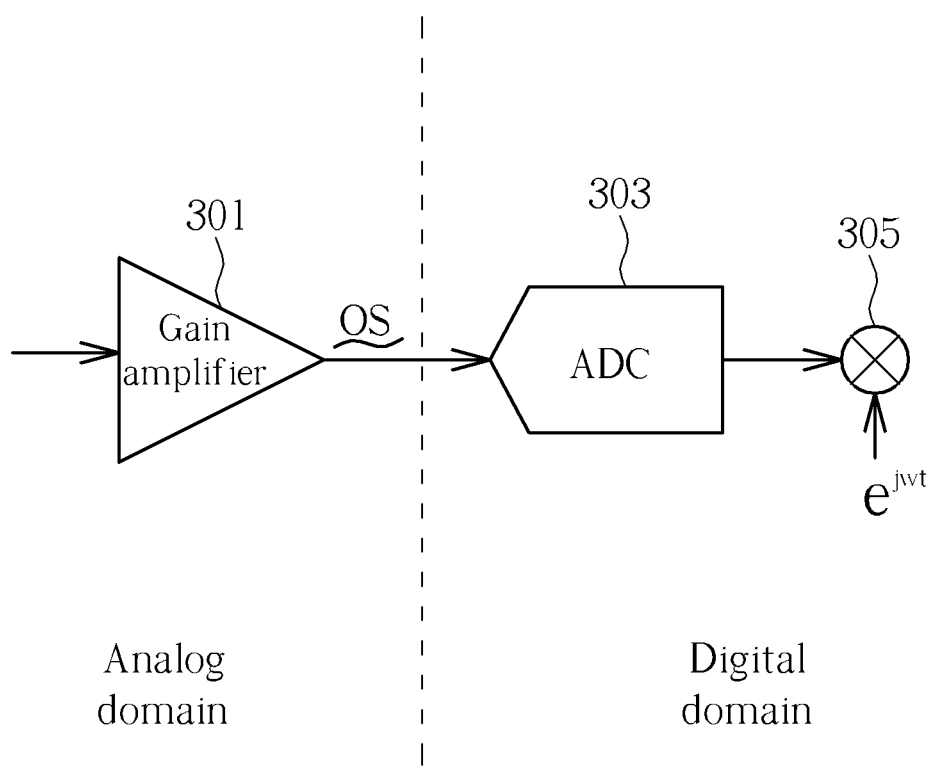
FIG. 3 is a schematic diagram illustrating how to compensate oscillating frequency drift after the oscillating frequency drift is acquired.

It should be noted that the embodiment shown in FIG. 2 is only for example, and do not mean to limit the scope of the present application. For example, if the signal already has enough intensity, the amplifier 205 can be omitted. Also, the Fourier transform converter can be substituted to acquire a max frequency in a specific range of twice the oscillating frequency $f_{OF}$ for the self-mixing signal SMS. In another embodiment, if a temperature of the transceiving circuit is detected, the relations between the temperature and the oscillating frequency drift are acquired. Such relations can be stored, and are utilized for compensation via the circuit shown in FIG. 3, while the oscillating frequency needs compensation. As shown in FIG. 3, the signal OS needing compensation is digitalized, and then is input the frequency mixer 305 in $e^{j\omega \cdot t}(\omega=2*pi*(\pm f_s))$, to compensate digitalized signal OS.

Figure 4:
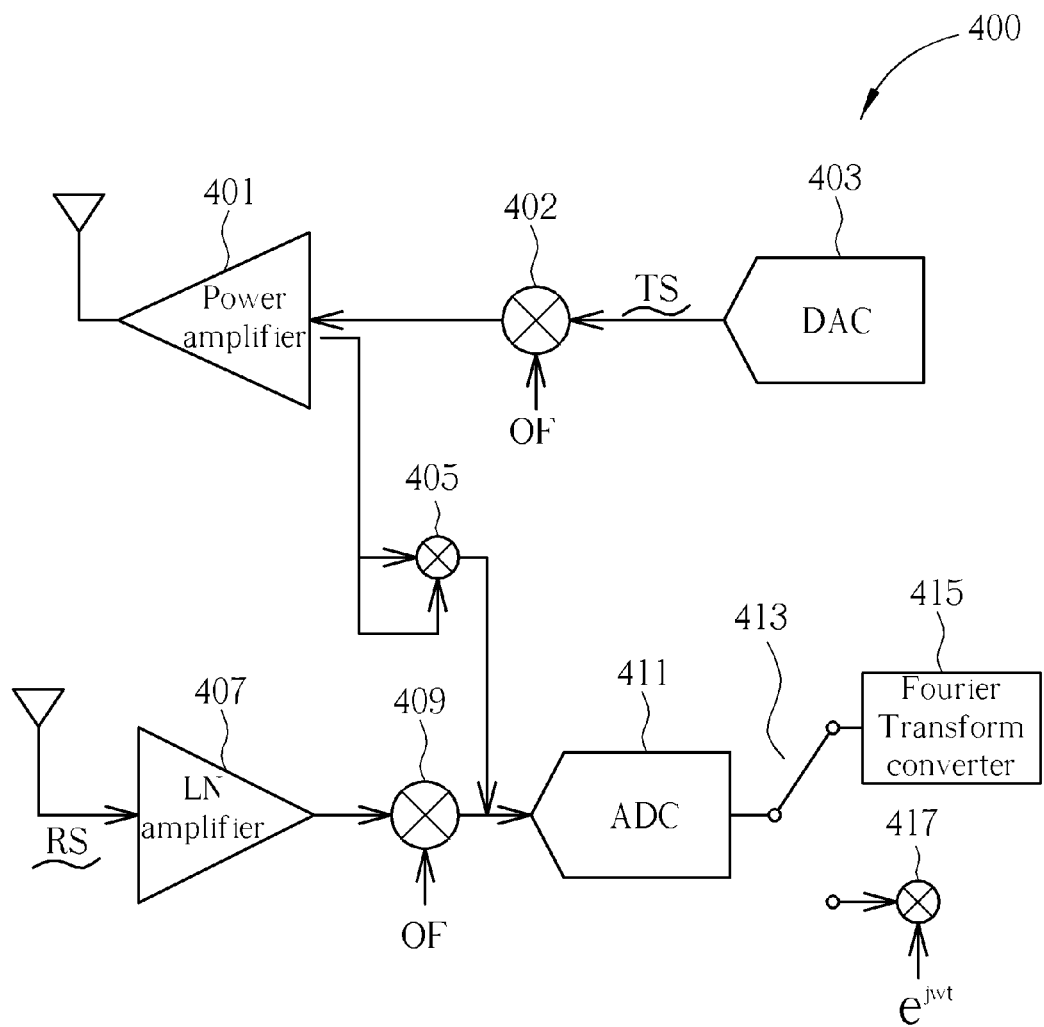
FIG. 4 is a circuit diagram illustrating how an oscillating frequency drift detecting circuit according to an embodiment of the present invention is applied to a transceiving circuit.

FIG. 4 is a circuit diagram illustrating how an oscillating frequency drift detecting circuit according to an embodiment of the present invention is applied to a transceiving circuit 400. As shown in FIG. 4, the power amplifier 401, the frequency mixer 402, the DAC 409 and the ADC 411 constitute a signal transmitting path. Also, the low noise amplifier 407, the frequency mixer 408 and the ADC 411 constitute a signal receiving path. Please note the power amplifier 401 and the low noise amplifier 407 can be omitted in the embodiment recited in FIG. 4. Besides, the transceiving circuit 400 further comprises the frequency mixer 405, the switch device 413, the Fourier transform converter 415 and the frequency mixer 417, which can also be regarded as a compensation unit. In a normal state, the signal transmitting path is utilized to transmit a transmitting signal TS, and the signal receiving path is utilized to receive a receiving signal RS. Also, the switch device 413 controls the signal receiving path to couples to or directly connect to the frequency mixer 417, such that compensation can be performed when the temperatures changes. Moreover, in a frequency drift detecting mode, the switch device 413 couples the signal transmitting path to the Fourier transform converter 415. By this way, the frequency mixers 402, 405 and the Fourier transform converter 415 constitute the oscillating frequency drift detecting circuit shown in FIG. 2, which can detect if the oscillating frequency OF has oscillating frequency drift.

Figure 5:
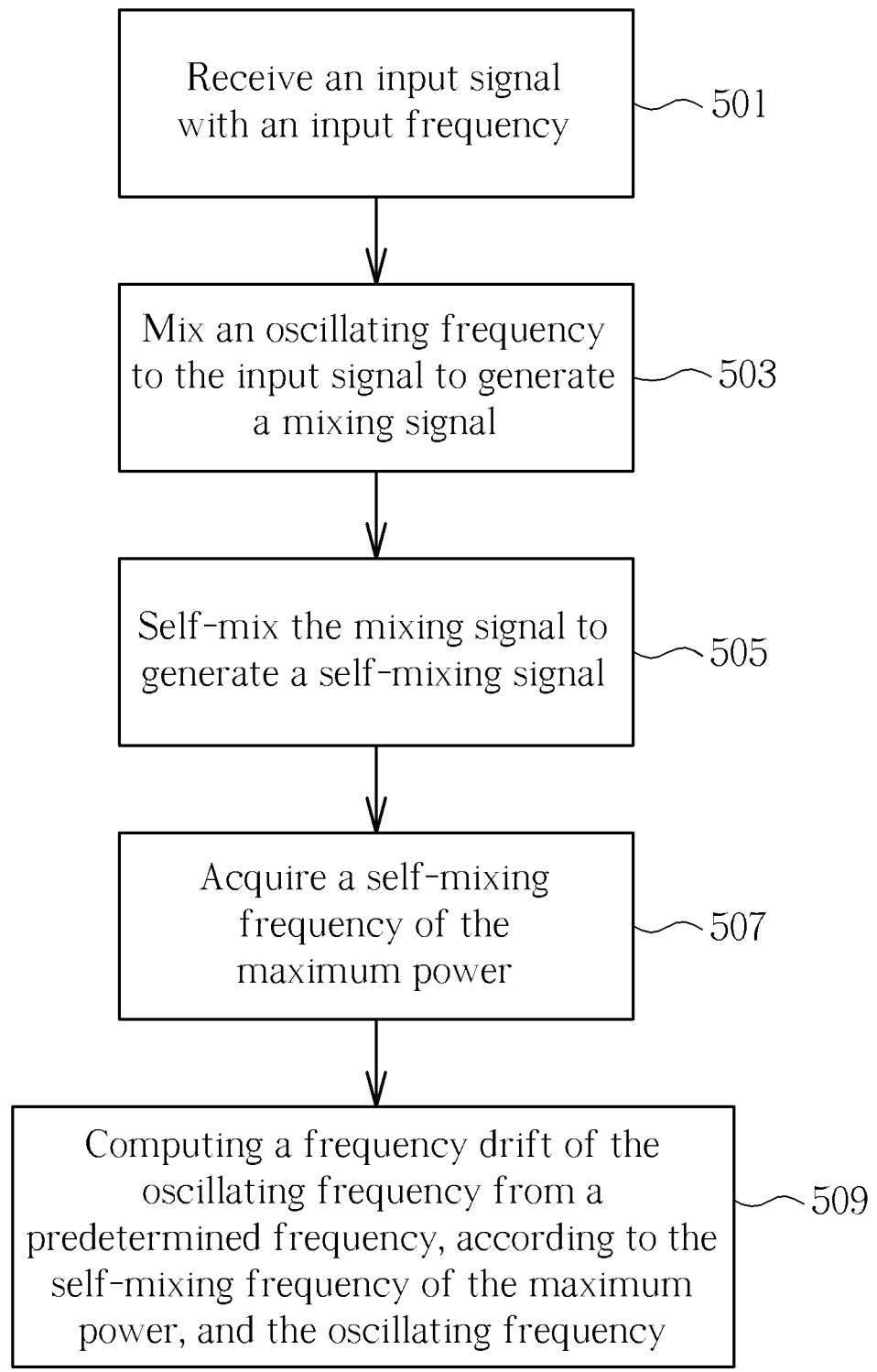
FIG. 5 is a flow chart illustrating an oscillating frequency drift detecting method according to one embodiment of the present application.

FIG. 5 is a flow chart illustrating an oscillating frequency drift detecting method according to one embodiment of the present application. The steps shown in FIG. 5 can be easily understood in view of above-mentioned embodiments, thus the description thereof is omitted for brevity here. Please note, the input signal IS can be ignored according to above-mentioned embodiments. In this case, the step 501 can be ignored, the step 503 and the step 505 can be amended to: generate the self-mixing signal according to the oscillating signal.

Figure 6:
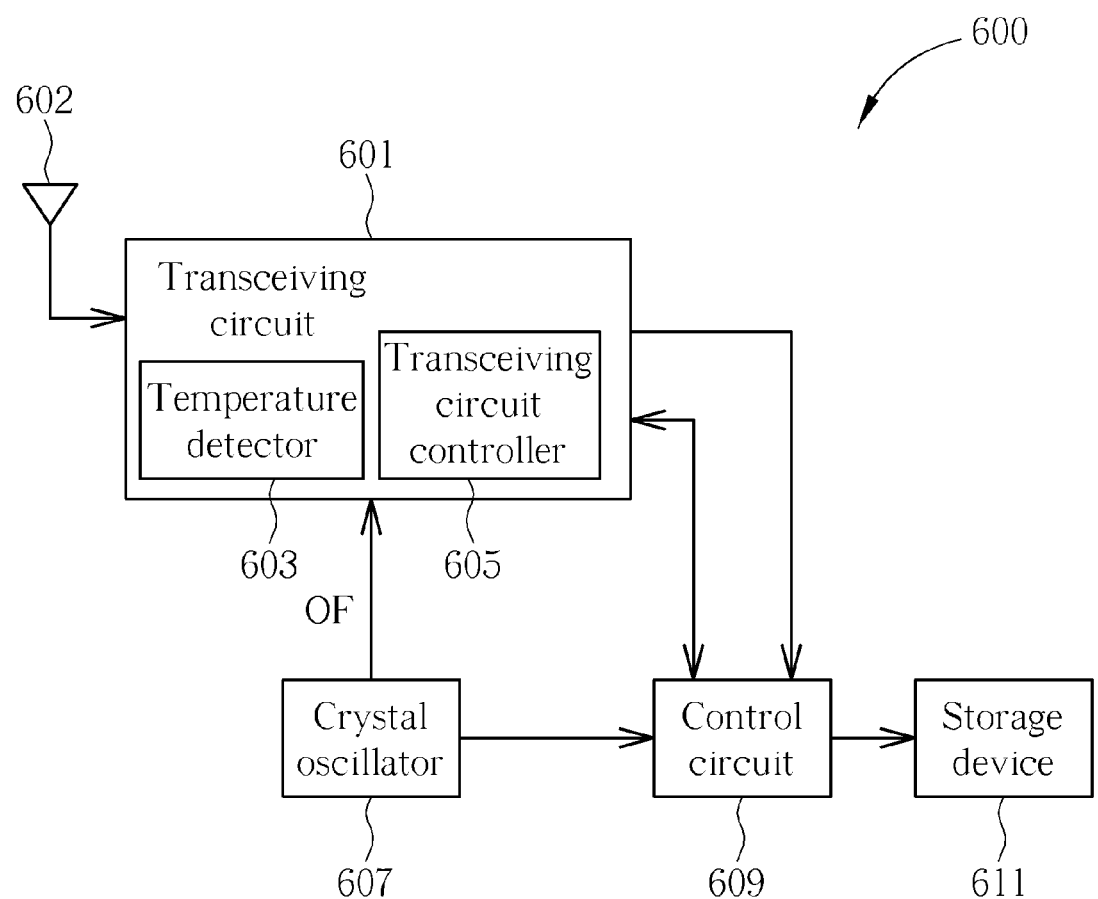
FIG. 6 is a schematic diagram illustrating an electronic apparatus utilizing the transceiving circuit shown in FIG. 4.

FIG. 6 is a schematic diagram illustrating an electronic apparatus utilizing the transceiving circuit shown in FIG. 4. As shown in FIG. 6, the electronic apparatus 600 includes a transceiving circuit 601, an antenna 602, a crystal oscillator 607, a control circuit 609 and a storage device 611. The transceiving circuit 601, which includes the circuit structure shown in FIG. 4, the temperature sensor 603 and the transceiving controller 603, can receive, transmit signal in a normal mode, and detects the oscillating frequency drift of the crystal oscillator 607 in a detection mode. Simultaneously, the temperature detector 603 can detect a temperature T of the transceiving circuit, and transmits it to the transceiving controller 605. Thereby the control circuit 609 stores the relations between the oscillating frequency drift $f_s$ and the detected temperature T to the storage device 613. The control circuit 609 can perform frequency drift compensation, if the storage device 613 stores the relations between the oscillating frequency drift $f_s$ and the detected temperature T.

Figure 7:
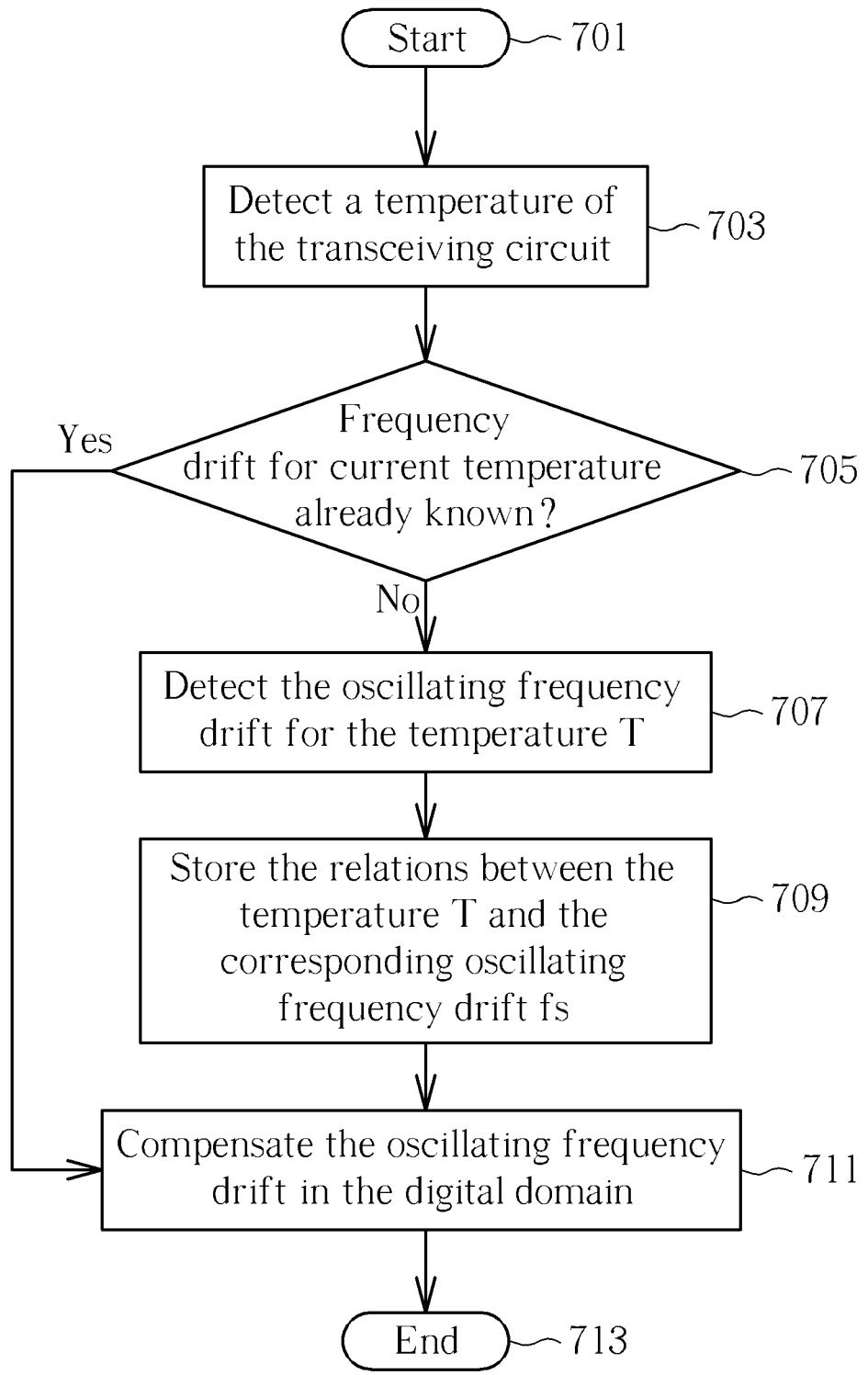
FIG. 7 illustrates the operation of the electronic apparatus shown in FIG. 6.

FIG. 7 illustrates the operation of the electronic apparatus shown in FIG. 6. FIG. 7 includes the following steps:

Step 701
Start.
Step 703
Detect a temperature of the transceiving circuit.
Step 705
Is frequency drift for current temperature known? If yes, go to step 711. If not, go to step 707.
Step 707
Detect the oscillating frequency drift for the temperature T.
Step 709
Store the relations between the temperature T and the corresponding oscillating frequency drift $f_s$. However, the step 709 can be omitted. That is, the temperature T and the corresponding oscillating frequency drift can be detected in real time, and goes to the step 711 for compensation, without storing.
Step 711
Compensate the oscillating frequency drift in the digital domain.

The oscillating frequency drift detecting circuit is not limited to detect the oscillating frequency drift caused by the temperature T. The drift maybe caused by any other factors.

Persons skilled in the art can understand that the circuits disclosed in the embodiment of the present application can be implemented in different ways. For example, the whole circuit of the control circuit 211 can be implemented by hardware language (ex. verilog or VHD). Also, either a CPU incorporating with software, or a controller incorporating with firmware can perform the above-mentioned operation or flow charts. Besides, some variations can be easily performed by persons skilled in the art based on the concept of the present application. For example, if the mixing-signal is self-mixed twice, another self-mixing frequency can be found in a specific range of other times of the frequency. Then the corresponding operation can still be performed to implement the present invention. Also, the input signal can be utilized as the objective for self-mixing, then corresponding operation can be performed to implement the present invention.

Those skilled in the art will readily observe that numerous modifications and alterations of the device and method may be made while retaining the teachings of the invention.

What is claimed is:

1. An oscillating frequency drift detecting method, comprising:
   receiving an oscillating signal with an oscillating frequency, wherein the oscillating signal is generated by a crystal oscillator;
   generating a self-mixing signal according to the oscillating signal;
   obtaining a self-mixing frequency of a maximum power of the self-mixing signal in a specific frequency range; and
   computing a frequency drift of the oscillating frequency, according to the self-mixing frequency of the maximum power, and the oscillating frequency.

2. The oscillating frequency drift detecting method of claim 1, further comprising receiving an input signal with an input frequency;
   wherein the step of generating a self-mixing signal according to the oscillating signal comprises: mixing the oscillating signal and the input signal to generate a mixing signal; self-mixing the mixing signal to generate the self-mixing signal;
   where the step of computing a frequency drift comprises computing the frequency drift according to the oscillating frequency, the input frequency, and the self-mixing frequency of the maximum power.

3. The oscillating frequency drift detecting method of claim 1, wherein the crystal oscillator is applied to a transceiving circuit, where the frequency drift detecting method comprises:
   detecting a temperature of the transceiving circuit; and
   storing a relation between the temperature and the frequency drift.

4. The oscillating frequency drift detecting method of claim 1, wherein the step of obtaining a self-mixing frequency of a maximum power comprises:
   transforming the self-mixing signal to a digital domain; and
   performing Fourier Transform to the self-mixing signal to acquire the self-mixing frequency of the maximum power.

5. The oscillating frequency drift detecting method of claim 1, wherein the step of computing a frequency drift comprises:
   dividing the self-mixing frequency with 2, and comparing the divided self-mixing frequency with the oscillating frequency to acquire the frequency drift.

6. The oscillating frequency drift detecting method of claim 1, wherein the specific frequency range is in a fix range of twice the oscillating frequency.

7. An oscillating frequency drift detecting circuit, comprising:
   a self-mixer, for generating a self-mixing signal according to an oscillating signal, wherein the oscillating signal includes an oscillating frequency; and
   a control circuit, for computing a self-mixing frequency of the self-mixing signal of a maximum power between a specific frequency range; and computing a frequency drift of the oscillating frequency, according to the self-mixing frequency and the oscillating frequency.

8. The oscillating frequency drift detecting circuit of claim 7, further comprising:
a frequency mixer, for mixing the oscillating signal to an input signal, to generate a mixing signal, wherein the input signal includes an input frequency, where the self-mixer self-mixing the mixing signal to generate the self-mixing signal; wherein the control circuit computes the frequency drift according to the oscillating frequency, the input frequency, and the self-mixing frequency of the maximum power.

9. The oscillating frequency drift detecting circuit of claim 8, is applied to a transceiving circuit.

10. The oscillating frequency drift detecting circuit of claim 9, wherein one signal transmitting path of the transceiving circuit shares the frequency mixer.

11. The oscillating frequency drift detecting circuit of claim 8, wherein the transceiving circuit further comprises:
a compensation unit; and
a switch device, coupled between the transceiving circuit and the compensation unit.

12. The oscillating frequency drift detecting circuit of claim 9, further comprising:
a temperature sensor, for detecting temperature of the transceiving circuit; and
a storage device, for recording relations of the temperature and the frequency drift.

13. The oscillating frequency drift detecting circuit of claim 7, wherein the specific frequency range is in a fix range of twice the oscillating frequency.

14. The oscillating frequency drift detecting circuit of claim 7, further comprising a Fourier transform converter, for performing Fourier Transform to the self-mixing signal after the self-mixing signal is transformed to a digital domain; wherein the control circuit acquires the self-mixing signal according to the self-mixing signal after Fourier Transform.

15. The oscillating frequency drift detecting circuit of claim 7, wherein the control circuit divides the self-mixing frequency with 2, and compares the divided self-mixing frequency with the oscillating frequency to acquire the frequency drift.

* * * * *